United States Patent [19]
Tokuno

[11] Patent Number: 5,869,886
[45] Date of Patent: Feb. 9, 1999

[54] FLIP CHIP SEMICONDUCTOR MOUNTING STRUCTURE WITH ELECTRICALLY CONDUCTIVE RESIN

[75] Inventor: Kenichi Tokuno, Tokyo, Japan

[73] Assignee: NEC Corporation, Tokyo, Japan

[21] Appl. No.: 826,750

[22] Filed: Mar. 24, 1997

[30] Foreign Application Priority Data

Mar. 22, 1996 [JP] Japan ................................. 8-065871

[51] Int. Cl.⁶ ................................................ H01L 21/283

[52] U.S. Cl. ...................... 257/678; 257/676; 257/687; 257/688; 257/692; 257/693; 257/711; 257/735; 257/737; 257/778; 257/738

[58] Field of Search ..................... 257/676–678, 257/685, 686, 687, 690, 692, 693, 710, 711, 735, 737, 738, 778

[56] References Cited

U.S. PATENT DOCUMENTS

| | | | |
|---|---|---|---|
| 4,922,321 | 5/1990 | Arai et al. ................................. | 257/737 |
| 5,334,857 | 8/1994 | Mennitt et al. .......................... | 257/737 |
| 5,433,822 | 7/1995 | Mimura et al. .......................... | 257/737 |
| 5,508,561 | 4/1996 | Tago et al. ................................ | 257/738 |

*Primary Examiner*—Tom Thomas
*Assistant Examiner*—Fetsum Abraham
*Attorney, Agent, or Firm*—Young & Thompson

[57] ABSTRACT

A semiconductor chip is flip chip bonded on a substrate wherein the semiconductor chip has a first surface on which bumps are provided. An insulating sealing resin is provided in a space defined between the semiconductor chip and the substrate and also around the semiconductor chip. An electrically conductive resin is provided which extends over a least a part of a second surface of the semiconductor chip, a part of the sealing resin and a ground pattern provided over the substrate.

22 Claims, 4 Drawing Sheets

1 : semiconductor chip
3 : bumps
5 : pads
7 : ground pattern
9 : solder resist

2 : evaporated gold film
4 : sealing resin
6 : substrate
8 : conductive resin

1 : semiconductor chip
4 : sealing resin
6 : substrate
3 : bumps
5 : pads
9 : solder resist 13 : ground aluminum wiring
15 : contact portion
17 : electrode pads
14 : ground electrode pad
16 : conductive chip 1 : semiconductor chip
6 : substrate
8 : conductive resin
11 : signal lines
4 : sealing resin
7 : ground pattern
9 : solder resist
12 : through hole

FLIP CHIP SEMICONDUCTOR MOUNTING STRUCTURE WITH ELECTRICALLY CONDUCTIVE RESIN

BACKGROUND OF THE INVENTION

1. Field of the Invention

The present invention relates to a semiconductor mounting structure, and more particularly to a flip chip semiconductor mounting structure.

2. Description of the Related Art

A conventional flip chip semiconductor mounting structure is illustrated in FIG. 1. A semiconductor chip 1 with bumps 3 is bonded on a substrate 1. The bumps 3 are bonded and electrically connected with mounting pads 5 which have been provided on a bonding surface of the substrate 1. A solder resist 9 is further provided over the bonding surface of the substrate 6 except for the mounting pads 5. The bumps 3 form a space between the semiconductor chip 1 and the substrate 6. A sealing resin 4 is provided in the space defined between the semiconductor chip 1 and the substrate 6.

FIG. 2 is a plane view illustrative of a semiconductor chip 16 adhered via an insulation material such as a glass material on a lead frame without use of die bonding. An insulation oxide film is formed over a surface of the semiconductor chip 16. A ground aluminum wiring 13 is provided over the insulation oxide film wherein the ground aluminum wiring 13 extends over peripheral portions of the semiconductor chip 16. Namely, the ground aluminum wiring 13 extends along each sides of the semiconductor chip 16 to encompass a center portion of the semiconductor chip 16. The insulation oxide film underlying the ground aluminum wiring 13 has a large number of contact holes 15 aligned along the ground aluminum wiring 13. Electrode pads 17 are aligned along the inside of the ground aluminum wiring 13. Ground electrode pads 14 are also provided in the alignments of the electrode pads 17. The ground electrode pads 14 are connected to the ground aluminum wiring 13. It is possible that a bottom surface of the semiconductor chip 16 is adhered via an insulation material such as glass material onto the lead frame. In this case, the ground electrode pads 14 are electrically connected via bonding wiring to external leads for grounding the package so that the substrate of the semiconductor chip 16 is grounded. The ground electrode pads 14 are connected to the ground aluminum wiring 13. This ground aluminum wiring 13 is further electrically connected via the contact holes 15 to the substrate of the semiconductor chip 16. As a result, the substrate of the semiconductor chip 16 are grounded with stability.

The semiconductor chip 16 may be mounted onto the substrate by use of not only the wire bonding but also bumps, for example, the flip chip bonding.

If the flip chip bonding is used to bond the semiconductor chip via bumps onto the mounting pads of the substrate as illustrated in FIG. 1, then the substrate of the semiconductor chip is grounded only via the bumps. Since, however, the ground resistance is large, it is difficult to keep the substrate of the semiconductor chip 1 at the ground potential with stability.

On the other hand, if the semiconductor chip is mounded on the substrate as illustrated in FIG. 2, then it is necessary to provide the ground aluminum wiring on the peripheral region of the semiconductor chip. It is also necessary to further provide a large number of contact holes for contacting the ground aluminum wiring to the substrate. It is furthermore necessary to provide bonding wires for connecting the ground electrode pads 14 to the external leads. For those reasons, the semiconductor chip area is caused to be enlarged. The assembling cost and the mounting cost are caused to be increased.

In the above circumstances, it had been required to develop a novel flip chip mounting structure for allowing stable operations of a semiconductor chip.

SUMMARY OF THE INVENTION

Accordingly, it is an object of the present invention to provide a novel flip chip mounting structure for allowing stable operations of a semiconductor chip.

The above and other objects, features and advantages of the present invention will be apparent from the following descriptions.

The present invention provides a semiconductor chip with a bottom surface bonded on a substrate by a flip chip bonding wherein the bottom surface of the semiconductor chip is electrically connected through an electrically conductive resin to a ground pattern provided on the substrate.

In accordance with the present invention, the semiconductor chip mounting structure comprises the following elements. A semiconductor chip is flip chip bonded on a substrate wherein the semiconductor chip has a first surface on which bumps are provided. An insulating sealing resin is provided in a space defined between the semiconductor chip and the substrate and also around the semiconductor chip. An electrically conductive resin is provided which extends over a least a part of a second surface of the semiconductor chip, a part of the sealing resin and a ground pattern provided over the substrate.

It is preferable to provide a metal film over the second surface of the semiconductor chip so that the electrically conductive resin is provided which extends over a least a part of the metal film, a part of the sealing resin and the ground pattern.

As described above, in accordance with the present invention, the second surface of the semiconductor chip is electrically connected via the electrically conductive resin to the ground pattern provided over the substrate, for which reason the ground resistance is reduced by the electrically conductive resin whereby a potential of the substrate of the semiconductor chip is stable at the ground potential. As a result, the operations of the semiconductor chip is stable.

BRIEF DESCRIPTIONS OF THE DRAWINGS

Preferred embodiments of the present invention will be described in detail with reference to the accompanying drawings.

DISCLOSURE OF THE INVENTION

Figure 1:
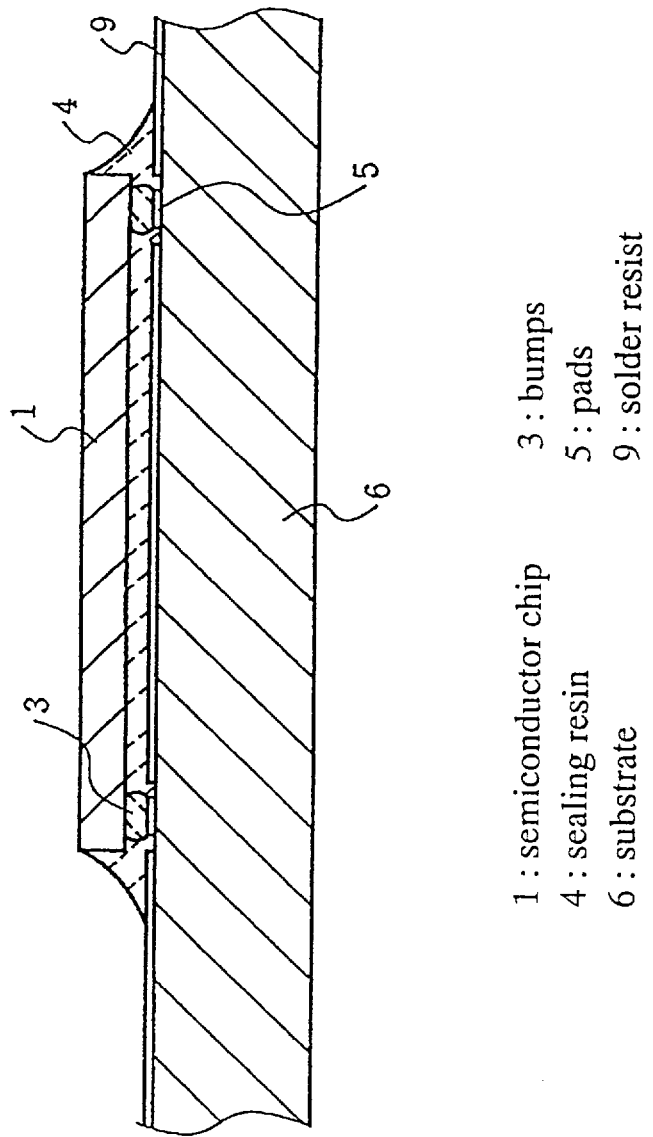
FIG. 1 is a fragmentary cross sectional elevation view illustrative of a semiconductor chip mounted on a substrate in the conventional flip chip bonding method.
Figure 2:
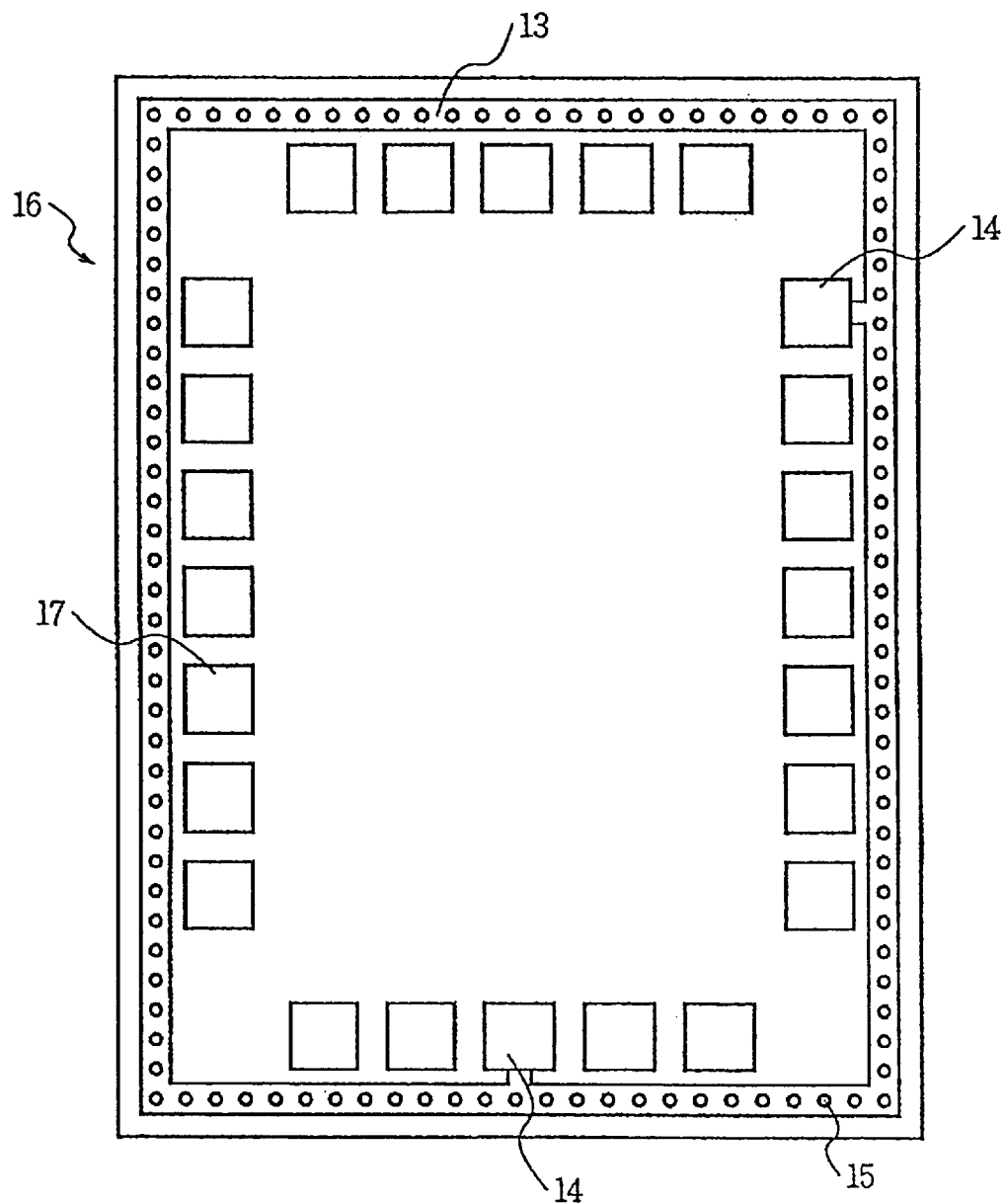
FIG. 2 is a plane view illustrative of a semiconductor chip adhered on a substrate via an insulation material such as a glass material in the other conventional bonding method.

The present invention provides a flip chip mounting structure comprising the following elements. A semiconductor chip has a first surface on which a plurality of bumps are provided and a second surface. A substrate has a bonding surface on which mounting pads are provided so that the bumps are bonded with the mounting pads to bond the semiconductor chip to the substrate. An insulation sealing material is provided in a space defined between the first surface of the semiconductor chip and the bonding surface of the substrate. A conductive pattern is selectively provided over at least a part of the substrate positioned around the semiconductor chip. The conductive pattern is kept to have a ground potential. An electrically conductive resin is provided which extends over at least a part of the second surface of the semiconductor chip, a part of the insulation sealing material and a part of the conductive pattern to electrically connect the semiconductor chip to the conductive pattern so as to keep the semiconductor chip at the ground potential with stability.

It is possible to further provide a solder resist film on the bonding surface of the substrate. The solder resist film extends not to contact with the bumps and has an opening portion which is positioned over the conductive pattern and adjacent to the semiconductor chip, so that the conductive pattern adjacent to the semiconductor chip is shown through the opening portion and the electrically conductive resin extends on the conductive pattern shown through the opening portion.

It is preferable that the electrically conductive resin is a silver epoxy resin.

It is also preferable that the electrically conductive resin is a copper epoxy resin.

It is also preferable that the electrically conductive resin is a silver palladium epoxy resin.

It is also preferable that the electrically conductive resin is a palladium epoxy resin.

It is also preferable to further provide a metal film provided on the second surface of the semiconductor chip so that the electrically conductive resin extends over the metal film.

It is also preferable that the metal film is made of gold.

The present invention provides a flip chip mounting structure comprising the following elements. A semiconductor chip has a first surface on which a plurality of bumps are provided and a second surface. A substrate has a bonding surface on which mounting pads are provided so that the bumps are bonded with the mounting pads to bond the semiconductor chip to the substrate. An insulation sealing material is provided in a space defined between the first surface of the semiconductor chip and the bonding surface of the substrate. A conductive pattern is selectively provided over at least a part of the substrate positioned around the semiconductor chip. The conductive pattern is kept to have a ground potential. An electrically conductive resin extends between at least a part of the second surface of the semiconductor chip and a part of the conductive pattern to electrically connect the semiconductor chip to the conductive pattern so as to keep the semiconductor chip at the ground potential with stability.

It is preferable to further provide a solder resist film on the bonding surface of the substrate. The solder resist film extends not to contact with the bumps and having an opening portion which is positioned over the conductive pattern and adjacent to the semiconductor chip so that the conductive pattern adjacent to the semiconductor chip is shown through the opening portion and the electrically conductive resin extends on the conductive pattern shown through the opening portion.

It is also preferable that the electrically conductive resin is a silver epoxy resin.

It is also preferable that the electrically conductive resin is a copper epoxy resin.

It is also preferable that the electrically conductive resin is a silver palladium epoxy resin.

It is also preferable that the electrically conductive resin is a palladium epoxy resin.

It is also preferable to further provide a metal film on the second surface of the semiconductor chip so that the electrically conductive resin extends over the metal film.

It is also preferable that the metal film is made of gold.

The present invention provides a flip chip mounting structure comprising the following elements. A semiconductor chip has a first surface on which a plurality of bumps are provided and a second surface. A substrate has a bonding surface on which mounting pads are provided so that the bumps are bonded with the mounting pads to bond the semiconductor chip to the substrate. A conductive pattern is selectively provided over at least a part of the substrate positioned around the semiconductor chip. The conductive pattern is kept to have a ground potential. An electrically conductive resin extends between at least a part of the second surface of the semiconductor chip and a part of the conductive pattern to electrically connect the semiconductor chip to the conductive pattern so as to keep the semiconductor chip at the ground potential with stability.

It is preferable to further provide a solder resist film provided on the bonding surface of the substrate, the solder resist film extending not to contact with the bumps and having an opening portion which is positioned over the conductive pattern and adjacent to the semiconductor chip so that the conductive pattern adjacent to the semiconductor chip is shown through the opening portion and the electrically conductive resin extends on the conductive pattern shown through the opening portion.

It is also preferable that the electrically conductive resin is a silver epoxy resin.

It is also preferable that the electrically conductive resin is a copper epoxy resin.

It is also preferable that the electrically conductive resin is a silver palladium epoxy resin.

It is also preferable that the electrically conductive resin is a palladium epoxy resin.

It is preferable to further provide a metal film on the second surface of the semiconductor chip so that the electrically conductive resin extends over the metal film.

It is preferable that the metal film is made of gold.

It is preferable to further provide an insulation sealing material in a space defined between the first surface of the semiconductor chip and the bonding surface of the substrate.

PREFERRED EMBODIMENT

Figure 3:
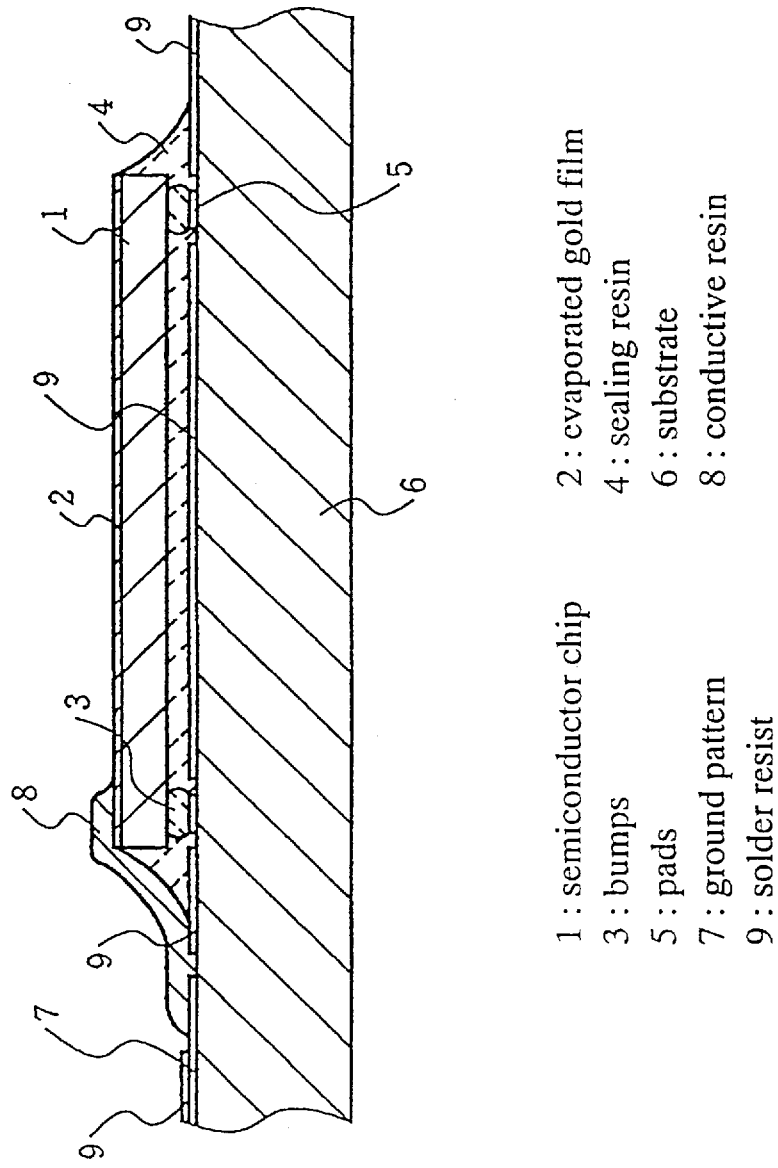
FIG. 3 is a fragmentary cross sectional elevation view illustrative of a semiconductor chip mounted on a substrate in a novel flip chip bonding method.

A preferred embodiment according to the present invention will be described in detail with reference to FIGS. 3 and 4 which are illustrative of a semiconductor chip mounted on a substrate in a novel flip chip bonding method. A semiconductor chip 1 is bonded on a substrate 1. The semiconductor chip 1 has a first surface on which bumps 3 are provided so that the bumps 3 are bonded with and electrically connected to mounting pads 5 which have been provided on a bonding surface of the substrate 1. A solder resist 9 is further provided over the bonding surface of the substrate 6 except for the mounting pads 5. The bumps 3 form a space between the semiconductor chip 1 and the substrate 6. An epoxy sealing resin 4 is provided in the space defined between the semiconductor chip 1 and the substrate 6 and also around the semiconductor chip 1. The semiconductor chip 1 has a second surface opposite to the first surface wherein an evaporated gold film 2 is provided on the second surface. A ground pattern 7 is selectively provided on the bonding surface of the substrate 6. The ground pattern 7 is distanced from the mounting pads 5. An electrically conductive resin 8 is provided which extends over a part of the evaporated gold film 2, a part of the epoxy sealing resin 4 and the ground pattern 7 so that the semiconductor chip 1 is electrically connected via the electrically conductive resin 8 to the ground pattern 7 on the substrate 6.

Figure 4:
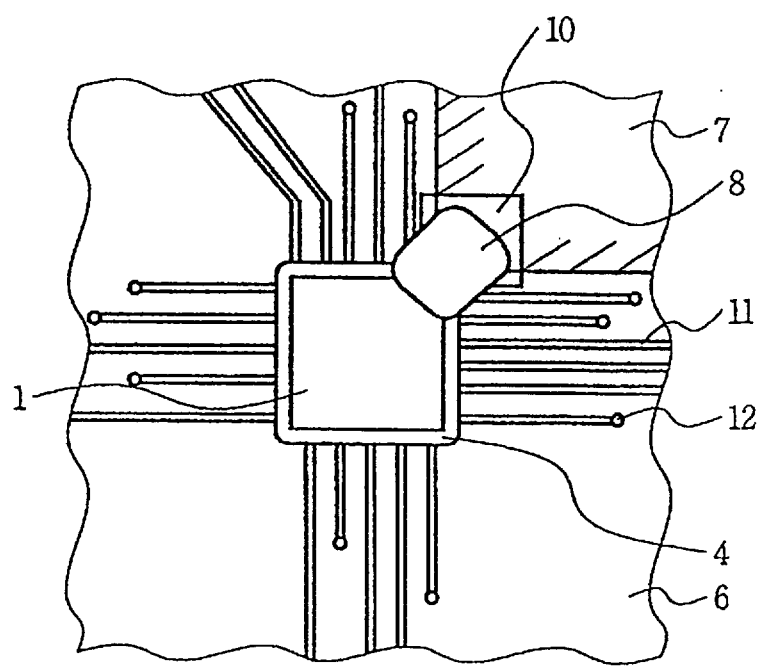
FIG. 4 is a plane view illustrative of a semiconductor chip mounted on a substrate in a novel flip chip bonding method.

As illustrated in FIG. 4, the semiconductor chip 1 is provided at a center of the substrate 6. The semiconductor chip 1 is square-shaped. A peripheral portion of the epoxy sealing resin 4 surrounds the semiconductor chip 1. Signal lines extend from each sides of the semiconductor chip 1 in a direction vertical to the each side thereof. Each signal line is terminated to a through hole. The ground pattern 7 is provided in a quarter area of the substrate 6 around the semiconductor chip 1. Both the substrate 6 around the semiconductor chip 1 and the ground pattern 7 are covered by the solder resist 9. The solder resist 9 has a solder resist opening portion 10 over one corner of the ground pattern 7 closer to the semiconductor chip 1 as well illustrated in FIG. 4 so that the one corner of the ground pattern 7 is shown through the solder resist opening portion 10. The electrically conductive resin 8 extends over one corner of the evaporated gold film 2 on the semiconductor chip 1, the epoxy sealing resin 4 and the ground pattern 7 shown through the solder resist opening portion 10.

The semiconductor chip 1 may be mounted as follows. Electrode pads of the semiconductor chip 1 are connected via bumps 3 to the mounting pads 5 of the substrate 6. A liquid epoxy sealing resin 4 is flowed into a space defined between the semiconductor chip 1 and the substrate 6 by utilizing a capillary phenomenon for subsequent causing a thermosetting. A silver epoxy paste is applied over one corner of the evaporated gold film 2 on the semiconductor chip 1, the epoxy sealing resin 4 and the ground pattern 7 shown through the solder resist opening portion 10 for subsequent thermosetting to thereby form the electrically conductive resin 8 so that the evaporated gold film 2 is electrically connected through the electrically conductive resin 8 to the ground pattern 7. The silver epoxy resin 8 has sufficiently large width and large contact area for reducing a ground resistance so that the substrate of the semiconductor chip 1 may have a stable ground potential thereby allowing stable operations of the semiconductor chip 1.

In place of the silver epoxy resin, a copper epoxy resin, a silver palladium epoxy resin and a palladium epoxy resin are also available as the electrically conductive resin.

It is also possible that the ground pattern is provided over the electrically conductive resin which extends over a part of the evaporated gold film 2 on the semiconductor chip 1 so as to keep the ground potential of the semiconductor chip 1.

As described above, in accordance with the present invention, the electrically conductive resin is provided to electrically connect the semiconductor chip 1 to the power source pattern such as the ground pattern. The silver epoxy resin 8 has sufficiently large width and large contact area for reducing a ground resistance so that the substrate of the semiconductor chip 1 may have a stable ground potential thereby allowing the semiconductor chip 1 to perform stable operations.

The electrically conductive resin provided makes it unnecessary to provide any ground aluminum wiring thereby allowing a reduction in area of the, semiconductor chip 1.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A flip chip mounting structure comprising:

a semiconductor chip having a first surface on which a plurality of bumps are provided, and a second surface;

a substrate having a bonding surface on which mounting pads are provided to facilitate said bumps being bonded with said mounting pads to bond said semiconductor chip to said substrate;

an insulation sealing material provided in a space defined between said first surface of said semiconductor chip and said bonding surface of said substrate;

a conductive pattern selectively provided over at least a part of said substrate positioned around said semiconductor chip, said conductive pattern being electrically connected to a ground potential;

an electrically conductive resin extending over at least a part of said second surface of said semiconductor chip, a part of said insulation sealing material, a part of said substrate, and a part of said conductive pattern, said conductive resin electrically connecting said semiconductor chip to said conductive pattern so as to keep said semiconductor chip at said ground potential with stability; and a solder resist film provided on said bonding surface of said substrate, said solder resist film being disposed so as not to contact said bumps and so as to leave exposed at least a portion of the conductive pattern adjacent to said semiconductor chip.

2. The flip chip mounting structure as claimed in claim 1, wherein said electrically conductive resin is a silver epoxy resin.

3. The flip chip mounting structure as claimed in claim 1, wherein said electrically conductive resin is a copper epoxy resin.

4. The flip chip mounting structure as claimed in claim 1, wherein said electrically conductive resin is a silver palladium epoxy resin.

5. The flip chip mounting structure as claimed in claim 1, wherein said electrically conductive resin is a palladium epoxy resin.

6. The flip chip mounting structure as claimed in claim 1, further comprising a metal film provided on said second surface of said semiconductor chip so that said electrically conductive resin extends over said metal film.

7. The flip chip mounting structure as claimed in claim 6, wherein said metal film comprises gold.

8. A flip chip mounting structure comprising:

a semiconductor chip having a first surface on which a plurality of bumps are provided, and a second surface;

a substrate having a bonding surface on which mounting pads are provided to facilitate said bumps being bonded with said mounting pads to bond said semiconductor chip to said substrate;

an insulation sealing material provided in a space defined between said first surface of said semiconductor chip and said bonding surface of said substrate;

a conductive pattern selectively provided over at least a part of said substrate positioned around said semiconductor chip, said conductive pattern being electrically connected to a ground potential;

an electrically conductive resin extending between at least a part of said second surface of said semiconductor chip, a part of said substrate, and a part of said conductive pattern, said conductive resin electrically connecting said semiconductor chip to said conductive pattern so as to keep said semiconductor chip at said ground potential stability; and a solder resist film provided on said bonding surface of said substrate, said solder resist film being disposed so as not to contact said bumps and so as to leave exposed at least a portion of the conductive pattern adjacent to said semiconductor chip.

9. The flip chip mounting structure as claimed in claim 8, wherein said electrically conductive resin is a silver epoxy resin.

10. The flip chip mounting structure as claimed in claim 8, wherein said electrically conductive resin is a copper epoxy resin.

11. The flip chip mounting structure as claimed in claim 8, wherein said electrically conductive resin is a silver palladium epoxy resin.

12. The flip chip mounting structure as claimed in claim 8, wherein said electrically conductive resin is a palladium epoxy resin.

13. The flip chip mounting structure as claimed in claim 8, further comprising a metal film provided on said second surface of said semiconductor chip so that said electrically conductive resin extends over said metal film.

14. The flip chip mounting structure as claimed in claim 13, wherein said metal film comprises gold.

15. A flip chip mounting structure comprising:

a semiconductor chip having a first surface on which a plurality of bumps are provided, and a second surface;

a substrate having a bonding surface on which mounting pads are provided to facilitate said bumps being bonded with said mounting pads to bond said semiconductor chip to said substrate;

a conductive pattern selectively provided over at least a part of said substrate positioned around said semiconductor chip, said conductive pattern being electrically connected to a ground potential;

an electrically conductive resin extending between at least a part of said second surface of said semiconductor chip, a part of said substrate, and a part of said conductive pattern, said conductive resin electrically connecting said semiconductor chip to said conductive pattern so as to keep said semiconductor chip at said ground potential with stability.

16. The flip chip mounting structure as claimed in claim 15, wherein said electrically conductive resin is a silver epoxy resin.

17. The flip chip mounting structure as claimed in claim 15, wherein said electrically conductive resin is a copper epoxy resin.

18. The flip chip mounting structure as claimed in claim 15, wherein said electrically conductive resin is a silver palladium epoxy resin.

19. The flip chip mounting structure as claimed in claim 15, wherein said electrically conductive resin is a palladium epoxy resin.

20. The flip chip mounting structure as claimed in claim 15, further comprising a metal film provided on said second surface of said semiconductor chip so that said electrically conductive resin extends over said metal film.

21. The flip chip mounting structure as claimed in claim 20, wherein said metal film comprises gold.

22. The flip chip mounting structure as claimed in claim 15, further comprising an insulation sealing material provided in a space defined between said first surface of said semiconductor chip and said bonding surface of said substrate.

* * * * *